United States Patent
Doernbach et al.

(10) Patent No.: US 10,676,052 B2
(45) Date of Patent: Jun. 9, 2020

(54) POWER DISTRIBUTOR, AND ON-BOARD ELECTRICAL SYSTEM HAVING AT LEAST ONE POWER DISTRIBUTOR

(71) Applicant: LEONI BORDNETZ-SYSTEME GMBH, Kitzingen (DE)

(72) Inventors: Sebastian Doernbach, Gerbrunn (DE); Peter Grabs, Wuerzburg (DE); Ilja Uljanow, Wuerzburg (DE)

(73) Assignee: LEONI Bordnetz-Systeme GmbH, Kitzingen (DE)

( * ) Notice: Subject to any disclaimer, the term of this patent is extended or adjusted under 35 U.S.C. 154(b) by 0 days.

(21) Appl. No.: 16/348,605

(22) PCT Filed: Nov. 9, 2017

(86) PCT No.: PCT/EP2017/078818
§ 371 (c)(1),
(2) Date: May 9, 2019

(87) PCT Pub. No.: WO2018/087260
PCT Pub. Date: May 17, 2018

(65) Prior Publication Data
US 2020/0062200 A1  Feb. 27, 2020

(30) Foreign Application Priority Data

Nov. 11, 2016 (DE) .......................... 10 2016 222 173

(51) Int. Cl.
*B60R 16/03* (2006.01)
*H03K 19/007* (2006.01)
(Continued)

(52) U.S. Cl.
CPC ............. *B60R 16/03* (2013.01); *H02H 3/243* (2013.01); *H02H 7/222* (2013.01); *H03K 19/0075* (2013.01)

(58) Field of Classification Search
CPC ........ B60R 16/03; H02H 3/243; H02H 7/222; H03K 19/0075; H02J 1/10; B60W 50/023
See application file for complete search history.

(56) References Cited

U.S. PATENT DOCUMENTS 5,386,183 A * 1/1995 Cronvich ............. H02H 7/0822
  318/434
5,448,442 A * 9/1995 Farag ................... H02H 7/0822
  361/24

(Continued)

FOREIGN PATENT DOCUMENTS

DE   4445060 C1   4/1996
DE   19811626 A1   9/1998
(Continued)

*Primary Examiner* — Adolf D Berhane
(74) *Attorney, Agent, or Firm* — Laurence A. Greenberg; Werner H. Stemer; Ralph E. Locher

(57) ABSTRACT

A power distributor, in particular for an on-board network of a motor vehicle, has an intermediate tap, two power outputs, and one each switching unit for each power output. A switch is provided for a need-based blocking of the associated power output. Each of the switching units is designed in such a way that a blocking of the associated power output takes place, if, in the event a voltage drop at the associated power output and/or at the intermediate tap below a first setpoint value, an error case is determined. The greater the corresponding voltage drop, the faster the blocking of the associated power output takes place.

25 Claims, 8 Drawing Sheets

(51) Int. Cl.
*H02H 7/22* (2006.01)
*H02H 3/24* (2006.01)

(56) References Cited

U.S. PATENT DOCUMENTS

| | | |
|---|---|---|
| 5,642,251 A | 6/1997 | Lebbolo et al. |
| 5,962,934 A | 10/1999 | Fendt et al. |
| 6,127,741 A | 10/2000 | Matsuda et al. |
| 6,552,443 B1 | 4/2003 | Joehnke et al. |
| 7,095,134 B2 | 8/2006 | Sauer et al. |
| 7,471,494 B2 | 12/2008 | Ausserlechner |
| 8,450,881 B2 | 5/2013 | Wortberg |
| 8,531,808 B2 | 9/2013 | Wortberg |
| 2009/0109590 A1 | 4/2009 | Girot et al. |
| 2018/0043849 A1* | 2/2018 | Ishibashi ............. B60R 16/0207 |
| 2019/0296546 A1* | 9/2019 | Smith ....................... H02J 1/08 |

FOREIGN PATENT DOCUMENTS

| | | |
|---|---|---|
| DE | 19916452 A1 | 10/2000 |
| DE | 10317362 A1 | 11/2004 |
| DE | 10329914 A1 | 2/2005 |
| DE | 102004055057 A1 | 5/2006 |
| DE | 102005005236 A1 | 8/2006 |
| DE | 102008064393 A1 | 7/2010 |
| DE | 102009027387 A1 | 1/2011 |
| DE | 102011100392 A1 | 11/2012 |
| DE | 102012207624 A1 | 11/2013 |
| DE | 102015101235 A1 | 7/2016 |
| EP | 0711014 A1 | 5/1996 |
| EP | 0836966 A2 | 4/1998 |
| EP | 1493630 A2 | 1/2005 |

\* cited by examiner

POWER DISTRIBUTOR, AND ON-BOARD ELECTRICAL SYSTEM HAVING AT LEAST ONE POWER DISTRIBUTOR

BACKGROUND OF THE INVENTION

Field of the Invention

The invention relates to a power distributor, in particular for an on-board electrical system of a motor vehicle, having two power outputs and one intermediate tap. It additionally relates to an on-board electrical system having at least one such power distributor.

In the automotive sector, on-board electrical systems are increasingly being designed as so-called redundant on-board electrical systems, for high functional reliability. In this case, a corresponding redundant on-board electrical system has at least two electrical energy sources, which, independently of one another, can supply electrical loads integrated into the redundant on-board electrical system. Moreover, the corresponding electrical loads are typically connected to the electrical energy sources via two mutually independent power paths, such that, not only in the event of a failure of one of the two electrical energy sources, but also in the event of a failure of one of the power paths, i.e. in the event of an interruption along one of the power paths, the supply to the corresponding load can be maintained via the respectively other power path and the electrical energy source connected thereto.

The importance of such redundant on-board electrical systems has also recently increased because motor vehicles are increasingly being equipped with assistance systems. Corresponding assistance systems in this case serve, not only to increase comfort, but also to increase safety, for which reason it is to be ensured that they function with a high degree of reliability.

This is achieved, inter alia, by the used of the aforementioned on-board electrical systems, in which usually a plurality of power distributors are arranged, as supply nodes, in the form of a ring or in the form of a strand. In this case, each power distributor serves to supply a number of electrical loads, and has two supply inputs, via which electric power can be fed-in from two independent electrical energy sources.

Problematic for such redundant on-board electrical systems, however, are voltage drops caused, for example, by a so-called short circuit, since such voltage drops typically also propagate as far as the supply nodes, such that the supply voltage also breaks down at the supply nodes, i.e. at the power distributors. If then, for example, control devices are connected, as electrical loads, to such a power distributor, a corresponding voltage drop in the case of the latter generally results in these control devices falling into a so-called auto-reset operating state, or being reset, and consequently being inactive over a potentially problematically long time period. A driver assistance system that is realized by means of a corresponding control system then accordingly fails over a certain time period. This is problematic, in particular, in the case of driver assistance systems designed for partially automated or fully automated vehicle control, i.e. for so-called autonomous driving.

SUMMARY OF THE INVENTION

Proceeding from this, the invention is based on the object of specifying an advantageously realized on-board electrical system and an advantageously realized power distributor.

This object is achieved according to the invention by a power distributor (IPDN) as claimed, and by an on-board electrical system as claimed. Preferred developments are contained in the dependent claims. The advantages cited with regard to the power distributor and preferred designs can also be applied analogously to the on-board electrical system, and vice versa.

In this case, two concept approaches are pursued with a corresponding power distributor (IPDN) and/or with a corresponding on-board electrical system. One of the concept approaches in this case consists in realizing a more simply designed redundant on-board electrical system, and a more simply designed power distributor.

For this purpose, use is made of the fact that, typically, not all electrical loads are safety-relevant, and accordingly not all electrical loads are to be protected, or must be protected, by two independent supply possibilities. Consequently, the on-board electrical system and/or the power distributors used in the on-board electrical system can then be configured more simply. Such a simplified embodiment is advantageous, in particular, if it is used in a motor vehicle that has a relatively small number of safety-relevant electrical loads and/or that is realized only for partially automated vehicle control, and not for fully automated vehicle control. A power distributor (IPDN) realized for this purpose in this case has at least two switchable power outputs, which can each also be used as supply connections, the switchable power outputs preferably being designed in such a manner that, in the event of a fault situation, the power output respectively connected most directly to the fault source, and in particular only the power output respectively connected most directly to the fault source, is rapidly switched off, disconnected or blocked. Preferably, such a power distributor (IPDN) then does not have any further power outputs.

The second concept approach is that the simple supply nodes mentioned at the outset, for example the simple supply nodes of a ring form or ring circuit (power ring), are replaced by power distributors (IPDNs) having at least two switchable power outputs, the switchable power outputs preferably be designed in such a manner that, in the event of a fault situation, the power output respectively connected most directly to the fault source, and in particular only the power output respectively connected most directly to the fault source, or the power outputs respectively connected most directly to the power source, and in particular only the power outputs respectively connected most directly to the fault source, is or are rapidly switched off, disconnected or blocked.

Within the meaning of this application, in both cases the switching-off, disconnection or blocking has the effect that no more electric current can flow out of the power distributor (IPDN) via the corresponding blocked power output, whereas, typically, it is still possible for electric current to flow into the power distributor via the corresponding blocked supply connection.

Preferably used in this case for switching off, disconnecting or blocking is a delayed-switching switch-off element, with which, more preferably, the delay decreases the more the voltage drops, and with which, in particular, the delay is inversely proportional to the depth of the voltage drop, such that, for example in an arrangement of a plurality of switch-off elements, that which reacts and switches most rapidly is that which is located nearest to the origin of the voltage drop.

The fault situation in this case is identified, for example, by a dynamic evaluation of an occurring voltage drop or voltage collapse, wherein, more preferably, no further additional information is supplied to the corresponding power distributor or the corresponding power distributors from the outside via additional lines, such that this power distributor determines the fault situation semi-autonomously, or these power distributors determine the fault situation semi-autonomously, and switch off the power output concerned.

Specified as a fault situation in this case, in particular, is the case/operating state in which power/current flows out of the power distributor via a power output, while the voltage at the corresponding power output or at the intermediate tap is below a specified first setpoint value. This means that the fault situation exists, in particular, when a so-called hard short circuit occurs. The switching-off, disconnection or blocking by the switching of the switch-off element is therefore to be effected very rapidly, and accordingly a power distributor presented here is preferably realized in such a manner that the reaction time, i.e. the time difference between the drop of the voltage, at a power output or at the intermediate tap, and the blocking or the completion of the blocking of the corresponding power output is less than approximately 10 ms, preferably less than approximately 5 ms, and in particular less than 1 ms. A corresponding power distributor is therefore typically not suitable for protecting against so-called creeping short circuits such as described, for example, in DE 10 2009 027 387 A1. Furthermore, the specified first setpoint value is preferably a threshold value, upon undershooting of which the blocking of the corresponding power output is effected substantially irrespective of how long the undershooting lasts.

Thus, in particular, different threshold values, i.e. voltage values, are not specified for different undershoot times, but only one threshold value.

If a plurality of such power distributors, having switchable power outputs that have delayed-switching switch-off elements, are interconnected, for example in a ring form or in the form of a strand, to realize a supply network, and are connected to each other via line segments, then, upon the occurrence of a fault, for example a hard short circuit, in a line segment, the fault situation is ascertained most rapidly by the two line distributors connected thereto, and the switchable power outputs connected to the faulty line segment are switched off. As a consequence, the faulty line segment, thus for example a line segment causing a voltage collapse, is then, as it were, isolated, for which reason the voltage in the rest of the supply network stabilizes again, before further switch-off elements react. The voltage supply can thus be maintained continuously for the rest of the supply network, thus for example an on-board electrical system. Accordingly, control devices connected to such power distributors will not fall into an auto-reset operating mode, and the problems described at the outset will not occur.

More preferably, a power distributor described here is kept simple, for example by dispensing with an aforementioned additional line for additional information, thus for data communication, whereby highly reliable power distributors can be realized in a simple manner, and whereby corresponding power distributors can be manufactured relatively inexpensively.

The precise design of a corresponding power distributor is matched in this case to the respective application or intended use, the power distributor preferably being designed for use as part of an on-board electrical system of a vehicle for land, water or air, and in any case for a direct-current electrical supply system.

Such a power distributor in this case typically has an intermediate tap or, in particular if the power distributor is designed, for example, for an on-board electrical system having a plurality of corresponding power distributors, an intermediate tap realized as a supply output or supply node, for example for supplying a number of electrical loads, and two power outputs (of nearest IPDN/battery) as supply connections, which are normally realized as power connections and accordingly, depending on an operating mode, or depending on an operating state of the power distributor, serve as power inputs or as power outputs. Further, for each power output, the power distributor has a switching unit, having a switch for blocking the associated power output if required, such that a conductor segment connected to a power output, an on-board electrical sub-system connected thereto, or an electrical energy source connected thereto, thus in particular in the event of a fault, can be decoupled from the corresponding power distributor, whereby at least electric current is prevented from flowing out of the corresponding power output. In this way, the power outputs are realized as switchable power outputs.

In this case each of these switching units is realized in such a manner that blocking of the associated power output is effected if, in the case of a voltage drop below a first setpoint value at the associated power output and/or at the supply output, a fault situation is ascertained, wherein, the greater the corresponding voltage drop, preferably the faster the blocking of the associated power output is effected. This means that the switching units are preferably realized in such a manner that their reaction time depends on the voltage drop at the associated power output and/or at the supply output, and is the shorter, the greater the corresponding voltage drop.

The term voltage drop is used, within the meaning of this application, if the voltage, for example at a power output, drops below a specified limit value, the first setpoint value, starting from a typical operating or supply voltage, typically a value range around a so-called nominal voltage.

Moreover, specified as a fault situation, in particular, is the case/operating state in which power/current flows out of the power distributor via one of the power outputs, or in which power/current flows out of the power distributor via one of the power outputs while the voltage at the corresponding power output and/or at the supply voltage is below the specified first setpoint value.

Further, if the fault situation is ascertained by a switching unit, switchover of the associated switch, and thus blocking of the associated power output, is effected.

If a corresponding power distributor is thus realized, for example, for an on-board electrical system of a motor vehicle, the on-board electrical system is typically designed for a nominal voltage of 12 V, and accordingly a power distributor intended for this is also designed for nominal voltage of 12 V. The voltage fluctuations that usually occur during operation, and the tolerable deviations from the nominal voltage, then give a value range around the nominal voltage, the lowest value of which is specified as a limit or just as a first setpoint value, and is specified in the power distributor between the normal operation with a voltage above the limit and the fault situation in the case of a voltage below the limit. Accordingly, in the case of an on-board electrical system having a nominal voltage of 12 V, a first setpoint value is specified which, depending on which value range around the nominal voltage is to be regarded as tolerable, is 2 V to 7 V, and in particular 3 V to 5 V, below the value of the nominal voltage, thus 12 V, thus, for example, a first setpoint value of 8.8 V. The corresponding concept can also easily be transferred to on-board electrical systems having a higher voltage, for example 24 V or 48 V, the tolerance range typically being suitably adapted.

Further, preferably, each switching unit has a voltage monitoring unit for monitoring the voltage at the associated power output and/or at the intermediate tap, or at the supply output. Preferably part of such a voltage monitoring unit in this case is a comparator circuit, by means of which the voltage at the associated power input and/or at the intermediate tap, or at the supply output, is compared with the first setpoint value, which is generated, in particular, as a reference voltage for the comparator circuit and thus exists as a voltage.

Alternatively, the power distributor has only one voltage monitoring unit, in particular having a comparator circuit, by means of which both power outputs and/or the intermediate tap, or the supply output, is monitored. In this case, the two switching units are then linked to this voltage monitoring unit.

In addition, in an advantageous development, a delay element, in particular an RC element, is connected in series before each voltage monitoring unit. Each delay element in this case serves principally to time-delay a voltage drop at the voltage monitoring unit, thus for example at the input of a comparator circuit, with respect to a voltage drop occurring at the associated power output and/or at the intermediate tap, or at the supply output, wherein, the more slowly the voltage drops at the supply output, and/or the smaller the voltage drop at the corresponding supply output, or at the intermediate tap, or at the supply output, the more pronounced is the time delay. In this way, reaction times for the switching unit are specified that are quasi-dependent on voltage drop, without a plurality of voltage-dependent switching conditions having to be specified for this purpose. Consequently, preferably only one voltage threshold value is specified as a switching condition for the switching units, and only one voltage threshold value and the current direction are specified as switching conditions for the switching units. The switching condition in this case is not to be equated with the reaction time.

It is thereby possible, with corresponding power distributors, to construct, for example, an on-board electrical system in which only those power outputs that are closest to a fault source, thus in particular a short-circuit location, and thus, as it were, closest to the origin of the voltage drop, are ever blocked. In this case, use is made of the fact that, although the voltage drops at all supply nodes as a result of a corresponding fault, the depth of the voltage collapses at the supply nodes differs, and is dependent on how close a supply node is located to the origin of the voltage drop.

As an alternative or in addition to this, each switching unit has a current-direction monitoring unit, by means of which the direction of current flow at the corresponding power output is monitored, thus by which it is monitored whether power/current is flowing into the power distributor or out of the power distributor via this power output. Preferably in this case, the current monitoring is effected indirectly, by a voltage monitoring system, which furthermore preferably has a comparator circuit, by means of which, for example, the voltages before and after the associated switch, or before and after an auxiliary resistor at the corresponding power output, are compared with each other.

Advantageous in this case, in particular, is an embodiment of the power distributor in which each switching unit has a voltage monitoring unit having a comparator circuit, and a current-direction monitoring unit having a comparator circuit, and in which the outputs of the two comparator circuits of a switching unit are linked to each other, such that the power distributor belonging to a switching unit is then only blocked, by means of the associated switch, if power/current flows out of the power distributor, via the corresponding power output, while the voltage at the corresponding power output and/or at the intermediate tap, or at the supply output, is below the specified first setpoint value. For this purpose, the two comparator circuits are preferably linked to each other via at least one logic gate, for example realized as an AND gate, or via a logic circuit constructed, for example, from AND gates and OR gates, or from NAND gates and NOR gates. As an alternative to this, the two switching unit share a common voltage monitoring unit. In this case, each switching unit then expediently has a current-direction monitoring unit having a comparator circuit, and at least one logic gate that is realized, for example, as an AND gate, and the output of the common voltage monitoring unit is linked to both switching units via these two logic gates.

Furthermore, each switching unit is advantageously designed in such a manner that, following an ascertained fault situation, it maintains a blocking, at least until the blocking is removed via a reset circuit and/or by a manual reset in which, for example, a reset signal is fed into the power distributor, via a rest input on the power distributor. In this case, for example, following a blocking, a fault validation is then effected by a controller, for example a processor or a programmable control unit, and if appropriate unblocking is then effected in that, for example, a reset signal is fed into the power distributor by the controller. Alternatively, a corresponding reset input is realized, for example, as a socket on a housing of the power distributor, or the reset circuit has a pushbutton or switch for manual actuation, in which case a manual actuation causes the switching unit to be reset, and thus causes the associated power output to be unblocked. It is assumed in this case that the fault situation is normally ascertained only if a defect occurs that necessitates a repair action, for which reason unblocking of the corresponding supply output is to be effected only when a corresponding repair has been performed. Accordingly, the reset is then to be performed, for example, by a service employee, as part of a servicing operation.

In addition, in one embodiment variant, the power distributor is correspondingly realized in such a manner that a type of "lock" function is realized, by means of which the reaction capability of the other switching unit, or of all other switching units, is blocked temporarily, for example for a time period of approximately 100 to approximately 300 µs, as soon as a switching unit has reacted because of a fault situation. It is thus possible, for example, to prevent a switching unit from reacting, as it were, to voltage fluctuations caused by another switching unit, thus by the blocking operation of one of the power inputs. It must be considered in this case that voltage peaks may be triggered at the moment of switching, as the result of the blocking of a power output. Such a "lock" function in this case can be realized, for example, by logic gates and/or by an adaptation of the aforementioned logic circuit.

Further, a permanent blocking is preferably effected by means of a set memory, in each switching unit, that, upon ascertainment of the fault situation, is put into a state by which the associated power output is blocked and subsequently kept blocked. In the simplest case, this is a simple, quasi-digital memory having two states, the one state causing the blocking of the associated power output, while the other state causes the unblocking.

If such a set memory, on the one hand, and a reset circuit, on the other hand, are provided, it is expedient if the reset circuit is directly linked to the set memory. Then, for example, in the case of a reset operation, the set memory, for example a capacitor or a logic module, is pulled to a frame potential, which then corresponds to a low state, which causes, or at least enables, unblocking of the associated power output. For the purpose of blocking the power output, on the other hand, the set memory is correspondingly put into a high state, in which a voltage that is easily distinguishable from frame potential, for example 3 V, is applied to the set memory.

Moreover, a corresponding set memory in this case can easily be integrated into a simple logic circuit, such as the aforementioned, which is constructed from logic gates. Advantageous in this case, for example, is a logic circuit in which an OR gate is connected in series after an AND gate, and, more preferably, the set memory is connected to an input of the OR gate. As an alternative or in addition to this, the output of the OR gate is connected to the set memory, the output of the OR gate more preferably being used to drive the switch of the corresponding switching unit, which switch is typically realized by one or more semiconductor switches. Moreover, comparator circuits can advantageously be connected to the aforementioned AND gate.

Also advantageous is an embodiment of the power distributor in which each of the switching units has a comparator circuit for voltage monitoring, and a comparator circuit for current-direction monitoring, the two comparator circuits being linked to each other on the output side via an AND gate. There is then an OR gate connected in series after each AND gate, an input of the OR gate being connected to the aforementioned set memory, which is simultaneously connected to the output of the OR gate. In addition, directly or indirectly connected to the output of the OR gate is at least one semiconductor switch, which is blocked or unblocked in dependence on the output signal at the output of the OR gate. As an alternative to this, the two switching units again share a common voltage monitoring unit.

Irrespective of the precise design of the switching units of the power distributor, the switching units are preferably realized as autonomous switching units, in the sense that each switching unit has or realizes an isolated, autonomous logic unit, such that blocking of the associated power output or communication with other switching units in the corresponding power distributor or in other power distributors is effected. In particular, a data interface in a corresponding power distributor, via which the latter can be connected to other power distributors for exchange of information, is dispensed with in this case. Also, the corresponding switching units preferably do not have processors or programmable control units, for which reason the switching units, and ultimately also the power distributor, is kept simple. If, on the other hand, a processor or a programmable control unit is present, thus for example a controller, it is preferably not required and/or used for fault identification, fault ascertainment and/or for switching off, in particular locking of a power output.

In addition, it is advantageous in this case if a corresponding power distributor or each switching unit has an internal voltage supply circuit, which supplies the switching units, or the respective switching unit, and preferably acts to stabilize the voltage. The supply voltage of the switching units in this case is typically below the nominal voltage of the power distributor.

As already mentioned previously, the switch of each switching unit is formed by at least one semiconductor switch. It is expedient in this case if the power distributor or each switching unit has at least one voltage pump for driving the semiconductor switches in the power distributor, or the semiconductor switches of the respective switching unit, by which the semiconductor switches are unblocked for normal operation.

Should the switch of a switching unit be configured for higher power ratings, it is additionally expedient for it to be realized by a plurality of semiconductor switches connected in parallel, which are then also driven in parallel, and thus blocked and unblocked in parallel, thus in particular simultaneously. The semiconductor switches of a switching unit in this case are preferably of the same design.

Moreover, it is advantageous for the switching units of the power distributor, and in particular for the semiconductor switches of the switches, to provide an undervoltage protection, thus in particular at least one circuit, for example a comparator circuit, that only allows gate driving if the available supply voltage is sufficient for a full through-connection.

Furthermore, it is favorable if the switching units of the power distributor are realized on a printed circuit board, and/or if a corresponding power distributor or each switching unit of the power distributor has at least one input for driving and/or test signals.

Further, depending on the intended application, an on-board electrical system presented here has one or more power distributors, which is or are realized according to one of the previously described design variants.

According to an embodiment variant, the on-board electrical system in this case has a number of safety-relevant loads and a number of other loads, as well as a first on-board electrical sub-system and a second on-board electrical sub-system, wherein the first and the second on-board electrical sub-system are connected or linked to each other via a power distributor. In this case, for the purpose of redundant supply, the safety-relevant loads are preferably integrated into both on-board electrical sub-systems. For the purpose of single supply, the other loads are preferably each integrated into one of the two on-board electrical sub-systems, and/or connected to the intermediate tap of the power distributor.

The on-board electrical system in this case is then, as it were, divided in two, and preferably no further power distributors, thus no further power distributors of this design, are provided and used in the on-board electrical system. Such a design of the on-board electrical system is advantageous in this case, in particular, when the number of safety-relevant loads is relatively small and, accordingly, relatively few electrical loads are to have, or must have, double protection. Regarded as safety-relevant electrical loads in this case are, for example, control units, realized by means of which are driver assistance systems that are designed for partially automated control of a motor vehicle, i.e., that intervene, as it were, in the control of the motor vehicle.

Further, according to an advantageous development, all other loads are integrated into the first on-board electrical sub-system, and accordingly the second on-board electrical sub-system serves exclusively for additional protection of the safety-relevant loads, or all other loads are connected to the intermediate tap of the power distributor.

According to an alternative design variant, the safety-relevant loads, i.e. those electrical loads that are used to realize a safety-relevant function and deployed accordingly, are not integrated into both on-board electrical sub-systems for the purpose of redundant supply, but instead a comparable redundancy is achieved in that the safety-relevant loads are present twice, specifically once in the first on-board electrical sub-system and once in the second on-board electrical sub-system. The two principles can also be combined with each other, in which case some safety-relevant loads are present twice, and some safety-relevant loads are integrated into both on-board electrical sub-systems for the purpose of redundant supply.

In the case of such a design of an on-board electrical system, it is furthermore advantageous, depending on the intended purpose, if the two switching units of the power distributor are spatially separate from each other, and in particular are arranged in separate housings. In such a case, the intermediate tap is then expediently realized as a conductor connection or distributor node, which connects the two switching units, or the two separate housings, to each other in an electrically conducting manner, in particular for exchange of power or transmission of power.

In an advantageous development, the two switching units are then each arranged in a so-called fusebox, for example together with a distributor busbar and/or a number of melting fuses and/or other fuse elements, such as electronic fuses.

Alternatively, a plurality of power distributors, designed according to one of the aforementioned embodiment variants, realize an on-board electrical system, in which case a number of electrical loads are then preferably connected to each power distributor via its intermediate tap realized as a supply output. In the case of such a design of the on-board electrical system, the power distributors are then typically interconnected via their power outputs and intermediate connecting conductors, wherein two electrical energy sources are connected, for example, at two power outputs or at two intermediate taps of two power distributors, for the purpose of redundant supply of electric power to the electrical loads, such that, in the event of a short circuit along one of the connecting conductors, the latter is electrically isolated by the connected connecting conductors.

More preferably, depending on the embodiment variant, the power distributors also realize a distributor chain, respectively connected at the ends of which there is an electrical energy source, or alternatively the power distributors realize a distributor ring, wherein an electrical energy source is in each case connected to two power distributors.

BRIEF DESCRIPTION OF THE SEVERAL VIEWS OF THE DRAWING

Exemplary embodiments of the invention are explained in greater detail in the following on the basis of a schematic drawing. Therein.

In all figures, parts that correspond to each other are in each case denoted by the same references.

DESCRIPTION OF THE INVENTION

A power distributor 2, described exemplarily in the following and shown in outline in FIG. 1, serves preferably to realize a so-called supply node in an on-board electrical system 4, represented exemplarily in FIG. 3 to FIG. 6, of a motor vehicle 6.

Figure 1:
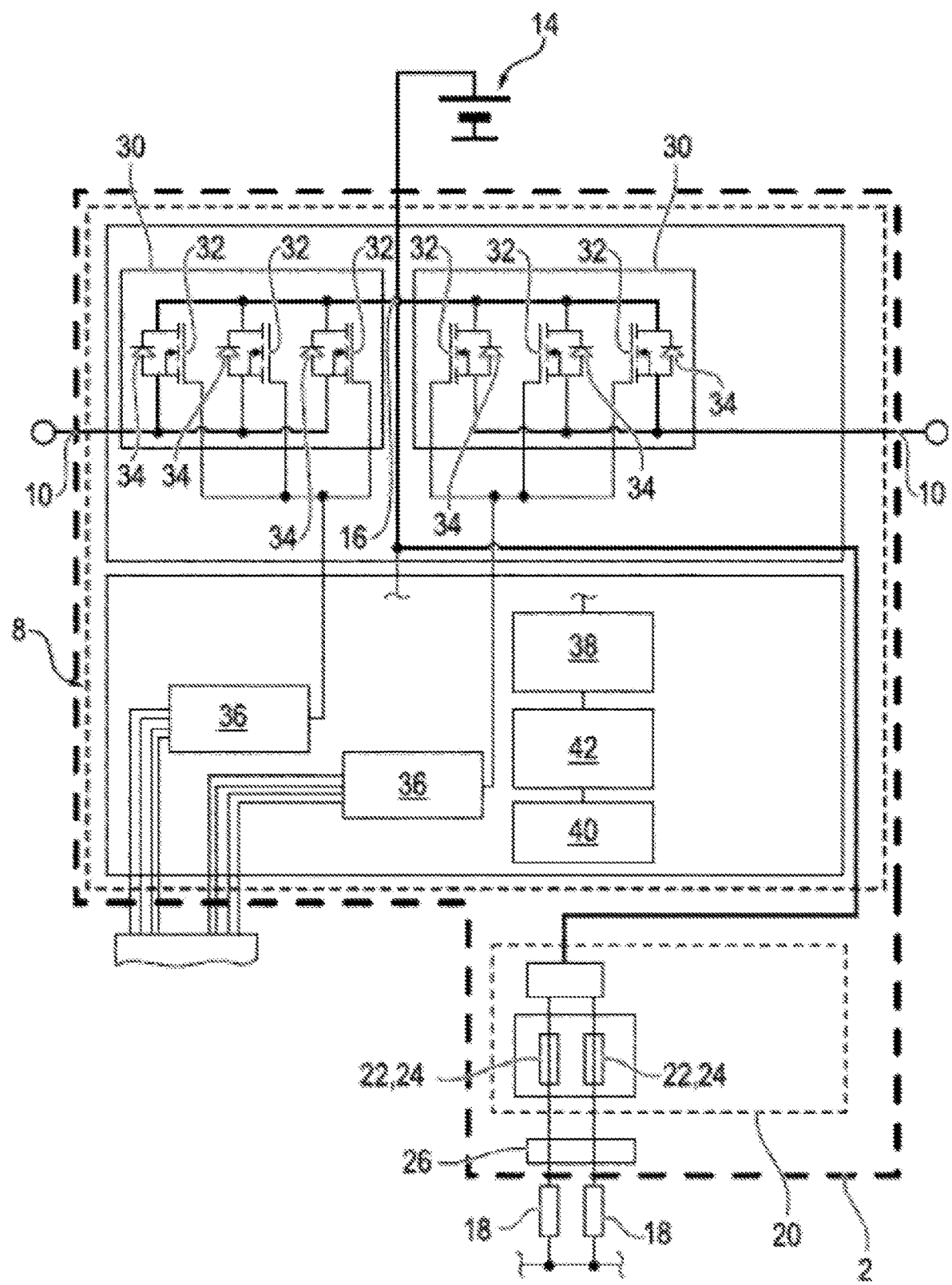
FIG. 1 shows a block diagram of a first embodiment of a power distributor, having a first embodiment of a control unit.

In the exemplary embodiment according to FIG. 1, that power distributor 2 in this case is realized at least partly on a printed circuit board 8 enclosed in a plastic housing, which is not included in the depiction. It has two power outputs 10, which are realized as power connections, such that, depending on the operating situation or operating state of the power distributor 2, electric power/current flows into the power distributor 2, or alternatively electric power/current flows out of the power distributor 2, via a corresponding power output 10. When the power distributor 2 is in the installed state, the corresponding power outputs 10 are then connected directly, or indirectly via line segments 12, to further power distributors 2, to other electrical assemblies and/or to electrical energy sources, for example a battery 14, such that the power distributor 2 realizes, in particular, a supply node in the on-board electrical system 4 of the motor vehicle 6.

Further, the power distributor 2 has an intermediate tap 16, which in the exemplary embodiment according to FIG. 1 is realized as a supply output 16, which is connected in series between the two power outputs 10 and via which a number of electrical loads 18 can be supplied with electrical energy when the power distributor 2 is in operation. For this purpose the supply output 16 in the exemplary embodiment according to FIG. 1 is realized as a distributor plate 20 having a plurality of connection arms 22, a melting fuse 24 being integrated into each connection arm 22, according to a principle known per se. In the exemplary embodiment, connected in turn to each connection arm 22 is a plug-in connector 26, at which an electrical load 18 can be connected via a plug-in connection. According to an alternative embodiment, the connection arms 22 jointly realize the plug-in contacts of a single plug-in connector 26.

The power distributor 2 additionally has a switching unit 28, having a switch 30 for each power output 10, which enables the associated power output 10 to be blocked if necessary.

In the exemplary embodiment according to FIG. 1, a corresponding switch 30 in this case is realized by three semiconductor switches 32 connected in parallel, a blocking diode 34 being connected in parallel to each semiconductor switch 32. The semiconductor switches 32 in this case are of substantially identical design, and configured for rapid switching operations. Preferably in this case, semiconductor switches 32 are used that can be blocked with a few µs, thus in 10 to 100 ρs.

Figure 2:
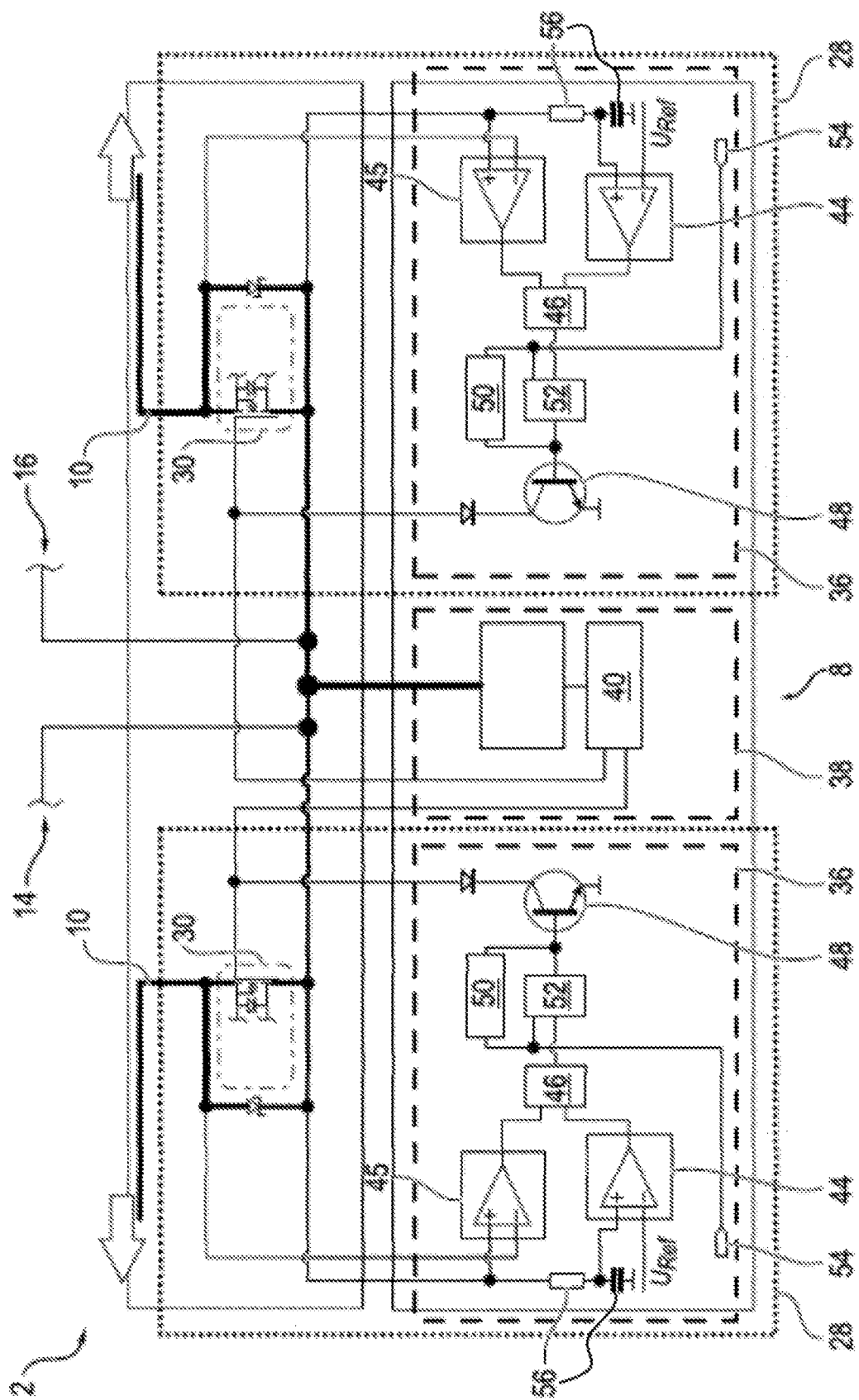
FIG. 2 shows a block diagram of a second embodiment of a power distributor, having a second embodiment of the control unit.

Provided in this case, in particular for applications having a relatively large power requirement, are switches 30 having a plurality of semiconductor switches 32 connected in parallel, to which the corresponding power is distributed. In the case of a lesser power requirement, and/or in cases in which the requirements for the switching speed are lower, a corresponding switch 30 may possibly be realized by means of only one semiconductor switch 32, and in such cases the use of a plurality of semiconductor switches 32 is also dispensed with. A corresponding exemplary embodiment, in which each switch 30 is realized by a single semiconductor switch 32, having a blocking diode 34 connected in parallel, is represented in FIG. 2.

Also part of each switching unit 28 is a control unit 36, by means of which the switch 30 of the corresponding switching unit 28 is driven, and by means of which it is determined whether the associated switch 30, and thus the associated power output 10, is blocked or unblocked. In the exemplary embodiment, in this case the control units 36 of the power distributor 2, on the one hand, and the switches 30 of the power distributor 2, on the other hand, are realized on different sides of the printed circuit board 8 and interconnected via through-platings. According to an alternative variant, the control units 36, on the one hand, and the switches 30, on the other hand, are realized on different printed circuit boards 8, which are then interconnected, for example, via lines, or alternatively the switching units 28 of the power distributor 2 are realized as a whole on one side of a printed circuit board 8.

In addition, in the exemplary embodiment the switching units 28 are realized in such a manner that, in an initial state, the semiconductor switches 32 of the switches 30 are blocked, without a supply voltage supplied from the outside or made available to the power distributor 2, and accordingly have to be unblocked for operation or normal operation of the power distributor 2 in the on-board electrical system 4. Used for this purpose is the voltage that is available, via the power outputs 10, in normal operation, from which voltage there is generated, by means of an internal voltage supply circuit 38 having a voltage pump 40, a supply voltage for the switching units 28, and in particular for the switches 30, that simultaneously unblocks the semiconductor switches 32 of the switches 30. The supply voltage of the semiconductor switches 32 of the switches 30 via the voltage supply circuit 38 in this case is typically maintained permanently, and accordingly the semiconductor switches 32 are normally unblocked as soon as a corresponding power distributor 2 is first installed in the motor vehicle 6 and connected to an electrical energy source, for example a battery 14. In some cases the corresponding internal voltage supply circuit 38 also has an undervoltage protection 42, which only releases the supply voltage for the switching units 28, and in particular for the switches 30, when the supply voltage is sufficient to fully switch-through all semiconductor switches 32.

When the semiconductor switches 32, and thus the switches 30, are unblocked, monitoring of the associated power outputs 10 is effected by the switching units 28 and, in the event of a fault situation being ascertained at a power output 10 by the switching unit 28, the corresponding power output 10 is blocked, in that the associated switch 30 is driven and thereby blocked. In the blocked state, current is prevented from flowing, via the corresponding power output 10, out of the power distributor 2.

The fault situation in this case exists at a power output 10 if power/current flows out of the power distributor 2 via this power output 10 while the voltage at the corresponding power output 10 is below a specified first setpoint value.

Accordingly, the voltages and current directions at the power outputs 10 are monitored by the switching units 28.

In the exemplary embodiment according to FIG. 2, the monitoring of the voltages at the power outputs 10 in this case is effected indirectly, by monitoring of the voltage at the intermediate tap 16, or at the supply output 16, it being assumed that the voltage at the voltage tap 16, or at the supply output 16, is comparable with the voltages at the power outputs 10 when the semiconductor switches 32 are closed. According to an alternative design, on the other hand, direct monitoring of the voltages is effected directly at the corresponding power outputs 10.

A corresponding voltage monitoring is effected in this case by a voltage monitoring unit 44, by means of which voltage drops at the intermediate tap 16, or at the corresponding supply output 16, can be detected. If, during operation of the power distributor 2, starting from a supply voltage or nominal voltage of, for example, approximately 12 volts, the monitored voltage falls below a specified first setpoint value of, for example, 9 volts, the first condition for the fault situation is thereby ascertained by the switching unit 28.

In this case, in the specification of the first setpoint value it is taken into account that the voltage in an on-board electrical system 4 typically varies locally and/or is subject to fluctuations over time. However, these variations are considered to be unproblematic, and accordingly should not result in ascertainment of the fault situation. At the same time, however, it is desirable that the power distributor 2, or rather the switching units 28, react as rapidly as possible to malfunctions in the on-board electrical system, specifically even when a malfunction, thus for example the occurrence of a defect in the component in the on-board electrical system 4, does not result in a complete collapse of the supply voltage in the on-board electrical system 4, thus in the voltage at a power output 0 dropping to a value in the range of a frame potential. A first setpoint value that is approximately 20% below the so-called nominal voltage is an advantageous compromise in this case.

Further, in the exemplary embodiment, the switching units 28, in addition to monitoring the voltage, monitor the current direction at the associated power output 10, by means of a current-direction monitoring unit 45. In this case, the current direction is ascertained indirectly, via a voltage difference, for which purpose, in turn, a comparator circuit is used, by which the potentials before and after the associated switch 30 are compared with each other. The second condition is then fulfilled when current flows out of the power distributor 2 via the associated power output 10.

In the exemplary embodiment, the fault situation only exists, however, if both conditions are fulfilled, thus if one switching unit 28 ascertains that current is flowing out of the power distributor 2, via the associated power output 10, while the voltage at the associated power output 10 is below the first setpoint value. Therefore, as represented in the exemplary embodiment according to FIG. 2, the two comparator circuits of each switching unit 28 are linked to each other on the output side via a simple logic means, i.e. here an AND gate 46.

The associated switch 30 in this case is blocked in that a semiconductor switch 48 connected in series after the AND gate 46 is unblocked, and as a result the potential at the gate of the semiconductor switch 32 of the switch 30 is pulled to a frame potential or a source potential. Once unblocked, the semiconductor switch 48 connected in series after the AND gate 46 is kept permanently unblocked by means of a set memory 50, as a result of which, ultimately, the associated switch 30 remains permanently blocked. For this purpose, connected in series after the AND gate is an OR gate 52 that, both on the input side and on the output side, is connected to the set memory 50. In the exemplary embodiment, a resetting of the set memory 50, which is realized, for example, as a capacitor, and consequently a blocking of the series-connected semiconductor switch 48 and ultimately an unblocking of the associated switch 30, is only possible in that the set memory 50, together with the associated input at the OR gate 52, is pulled, via a reset contact 54, to a frame potential or a source potential.

In addition to the reset contact 54, the power distributor 2 or each switching unit 28, depending on the embodiment variant, has further driving and test contacts or contact connections, which allow various signals to be fed in and/or read out in order, for example, to ascertain the state of the power distributor, or of the respective switching unit 28, thus in particular whether or not there is a defect present in the power distributor 2, or in the respective switching unit 28. For this purpose, for example as part of a servicing of the motor vehicle, a test device is then connected, via the contacts, or contact connections, to the power distributor 2, or to the respective switching unit 28. The resetting of the set memory 50 is typically effected as part of a servicing of the motor vehicle 6, specifically after the malfunction that resulted in the setting of the set memory 50, and thus in the blocking of the associated switch 30, has been eliminated.

Further, preferably connected in series before each voltage monitoring unit 44 is a delay element that is designed, for example, as an RC element 56. A voltage drop at the input of the voltage monitoring unit 44, thus, in the exemplary embodiment, at the input of the corresponding comparator circuit, is thereby additionally delayed with respect to a voltage drop occurring at the associated power output 10, or at the intermediate tap, or at the supply output 16, wherein, the less or the more slowly the voltage drops at the power output 10, or at the supply output 16, the greater is the delay.

Figure 3:
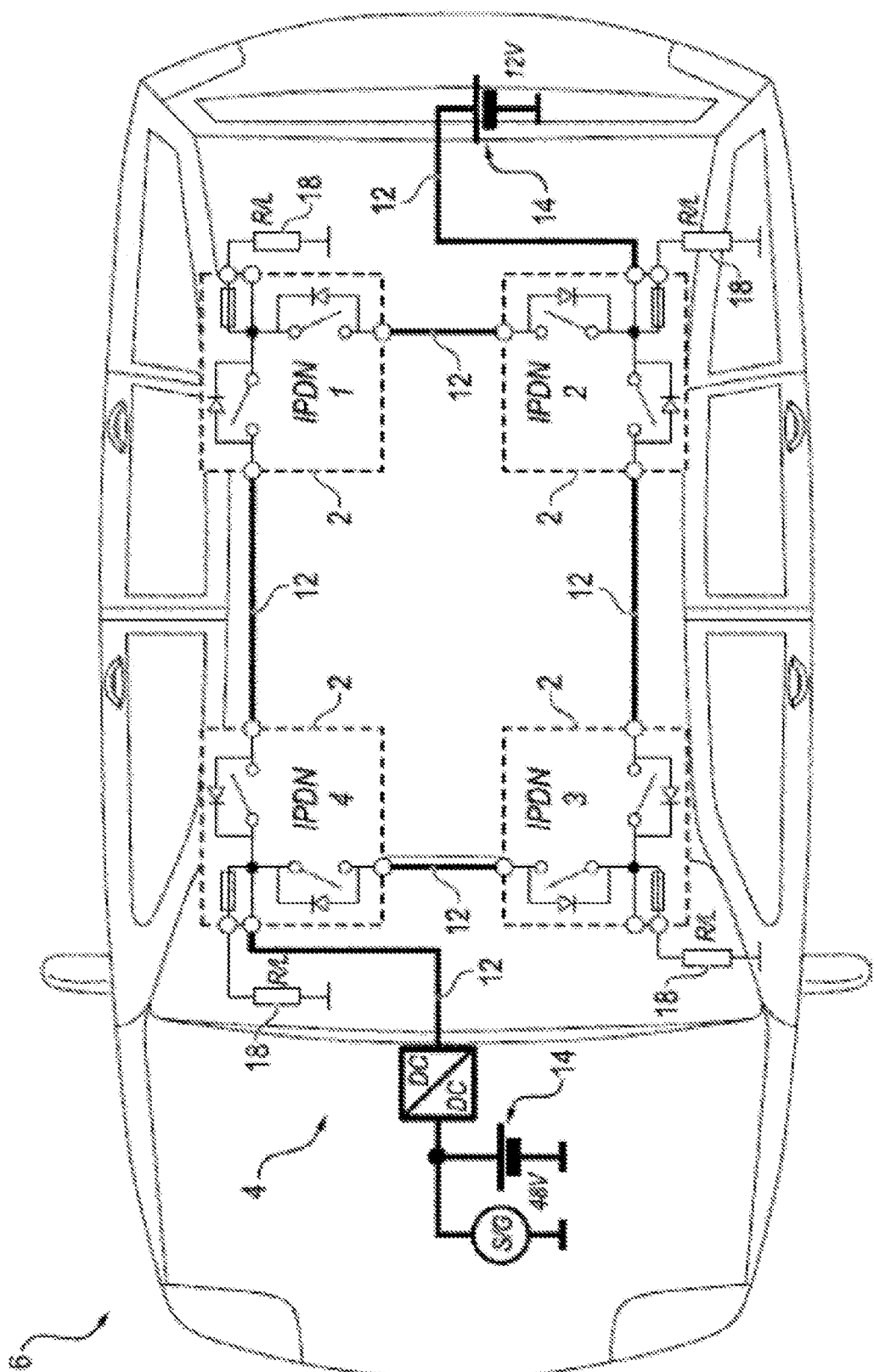
FIG. 3 shows a block diagram of a first embodiment of an on-board electrical system, having a plurality of power distributors.
Figure 4:
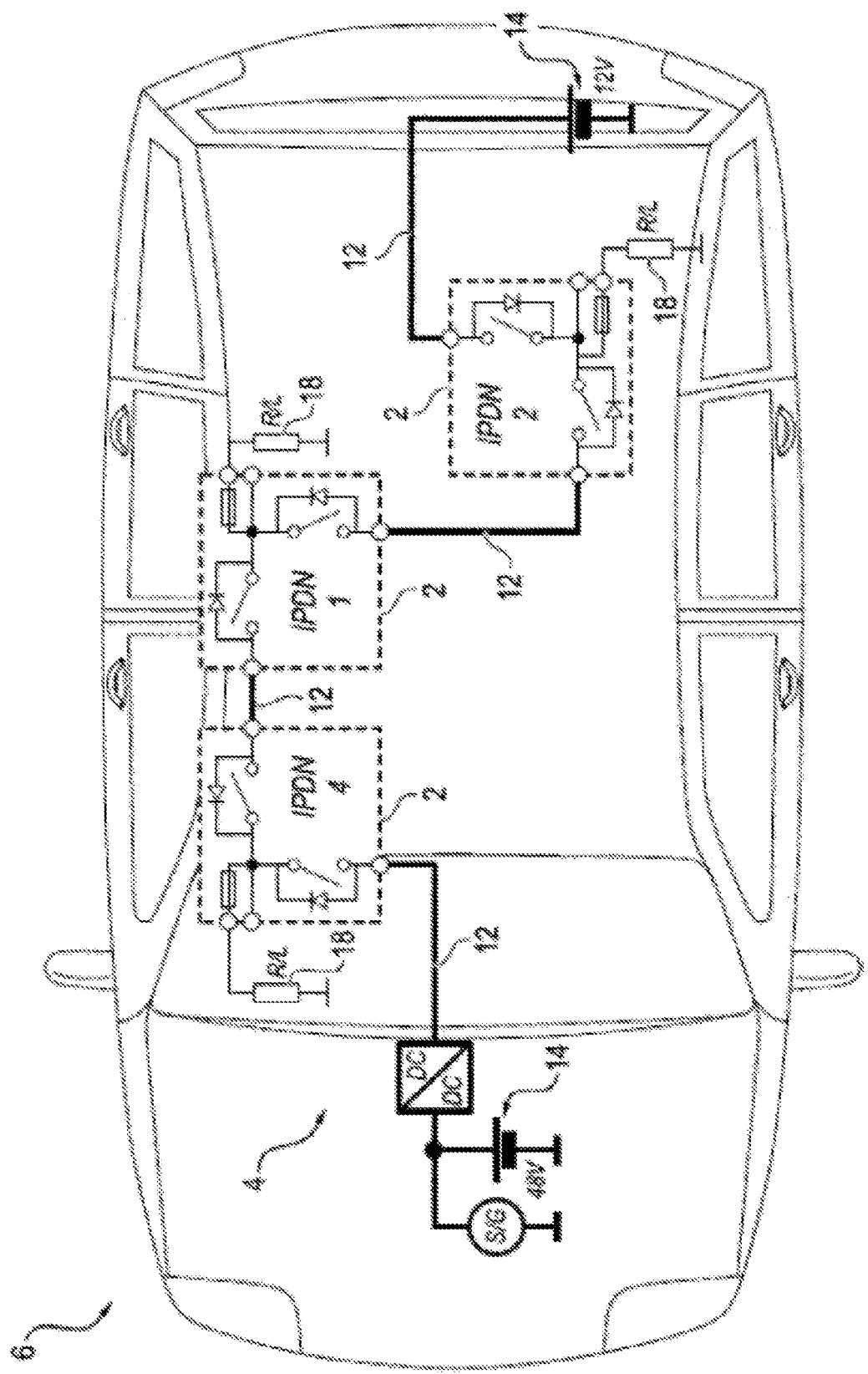
FIG. 4 shows a block diagram of a second embodiment of the on-board electrical system, having a plurality of power distributors.

With such a power distributor 2, it is then also possible to realize an advantageous, redundant on-board electrical system 2 in which, according to an embodiment variant, a plurality of power distributors 2, for example in the form of a ring, and represented in FIG. 3, or in the form of a strand, and represented in FIG. 4, are arranged, and are connected to two independent electrical energy sources, i.e. in particular two batteries 14.

If, for example, a short circuit, or other defect causing a significant voltage drop, then occurs in one of the line segments 12, then in each case only those switches that are closest to the defect along the current paths, i.e. that are positioned closest to the fault source, are blocked, as a result of which the corresponding line segment 12 is isolated. Following a corresponding isolation of a line segment 12, however, all power distributors 2 continue to be connected to at least one battery 14, such that the supply to the electrical loads 18 connected to the power distributors 2 is still ensured.

According to an alternative embodiment variant, the on-board electrical system 4 is realized with only one such previously described power distributor 2, the on-board electrical system 4 in this case preferably being constructed, as it were, in two parts, and accordingly having a first on-board electrical sub-system 58 and a second on-board electrical sub-system 60. An exemplary embodiment for this is depicted schematically in FIG. 5, wherein the second on-board electrical sub-system 60 is represented by a broken line.

The first on-board electrical sub-system 58 in this case serves to supply a number of safety-relevant electrical loads 62 and a number of other electrical loads 64, whereas the second on-board electrical sub-system 60 is realized exclusively to supply the safety-relevant electrical loads 62, such that the latter are additionally protected by a second supply possibility. This means that a redundant supply is provided only for the safety-relevant electrical loads 62.

The two on-board electrical sub-systems 58, 60 in this case are connected or linked to each other via the one power distributor 2, and accordingly in the fault situation, thus in the event of a previously described fault, the two on-board electrical sub-systems 58, 60 are separate from each other, with the result that only one of the two on-board electrical sub-systems 58, 60 fails and the supply to the safety-relevant electrical loads 62 continues to be ensured by the respective other on-board electrical sub-system 58, 60.

Figure 5:
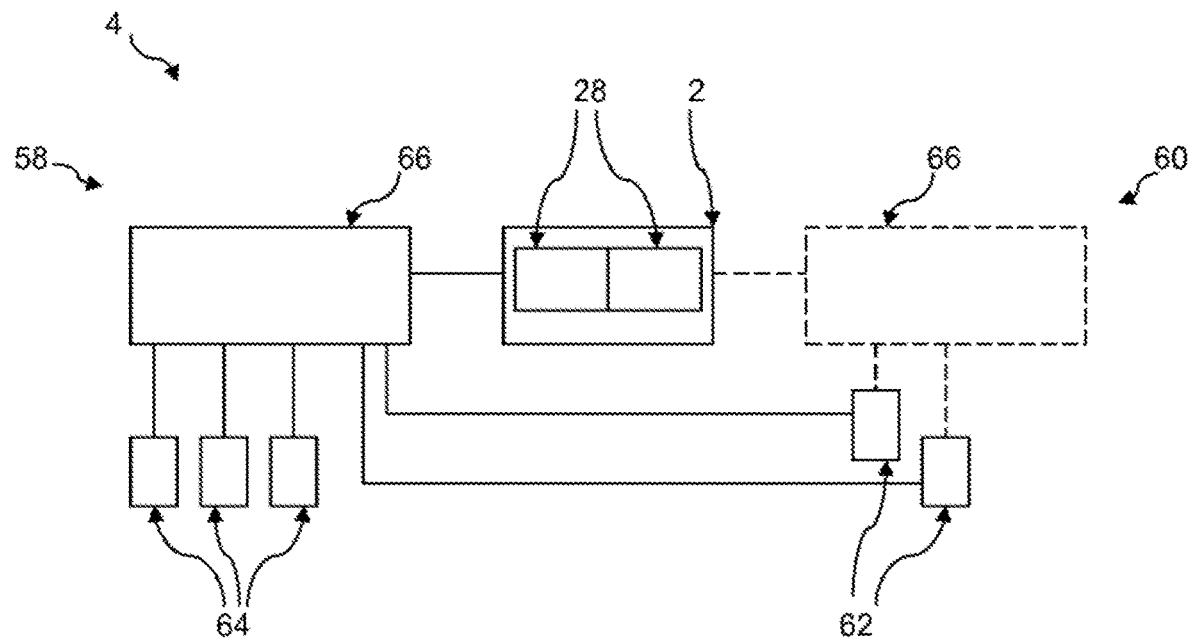
FIG. 5 shows a block diagram of a third embodiment of the on-board electrical system, having a power distributor.

In a modified variant of the on-board electrical system 4 according to FIG. 5, both on-board electrical sub-systems 58, 60 are used to supply other electrical loads 64, but in this case also the other electrical loads 64 are preferably each connected to only one of the two on-board electrical sub-systems 58, 60, such that the corresponding other electrical loads 64 fail if the associated on-board electrical sub-system 58, 60 fails.

Figure 6:
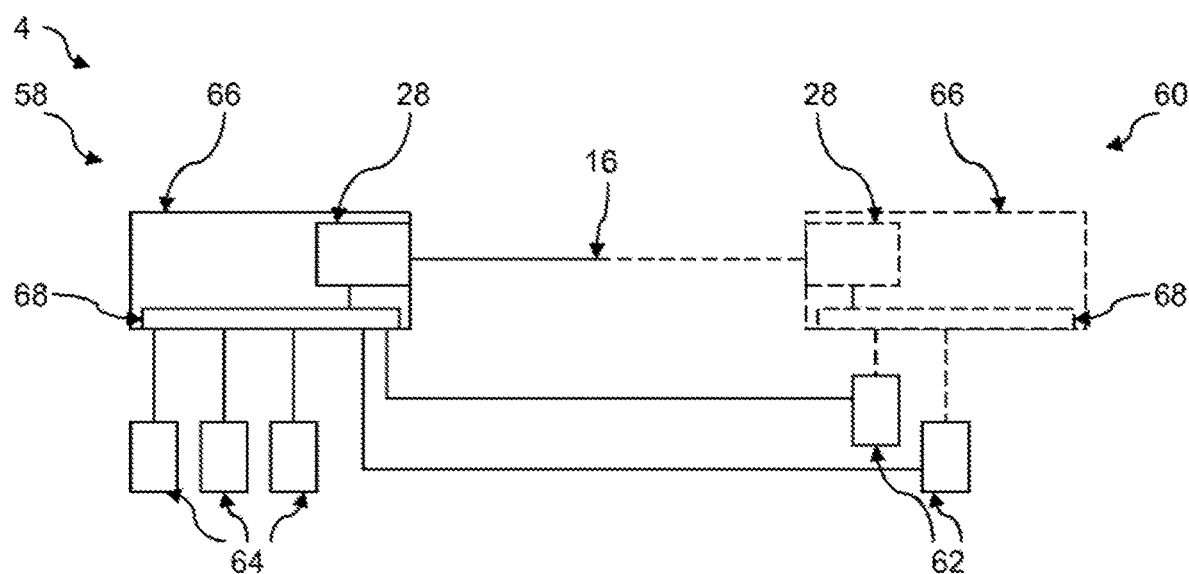
FIG. 6 shows a block diagram of a fourth embodiment of the on-board electrical system, having a power distributor.

A modification of the on-board electrical system 4 according to FIG. 5 is represented in FIG. 6, wherein, in this case, the two switching units 28 of the power distributor 2 are spatially separate from each other and arranged in separate housings. In this case, each of the two switching units 28 is preferably part of a so-called fusebox 66, in which a so-called distributor busbar 68 is arranged, as well as, typically, a number of fuse elements, for example melting fuses and/or electronic fuses. In the case of this embodiment variant, the power distributor 2 is, as it were, halved, and each of the two housing, or each fusebox has, as it were, half of a power distributor 2.

The two fuseboxes 66, with the switching units 28 contained therein, are furthermore expediently connected to each other in an electrically conducting manner via the intermediate tap 16 of the power distributor 2 for exchange of power or transmission of power, in which case the intermediate tap 16 is designed, for example, as a conductor connection or cable connection. One of the two fuseboxes 66 in this case is arranged in the front region of the moor vehicle 6, and the other of the two fuseboxes 66 is then arranged, for example, in the rear region of the motor vehicle 6.

Moreover, in the case of this embodiment, each switching unit 28 preferably has its own internal voltage supply circuit 38.

Figure 7:
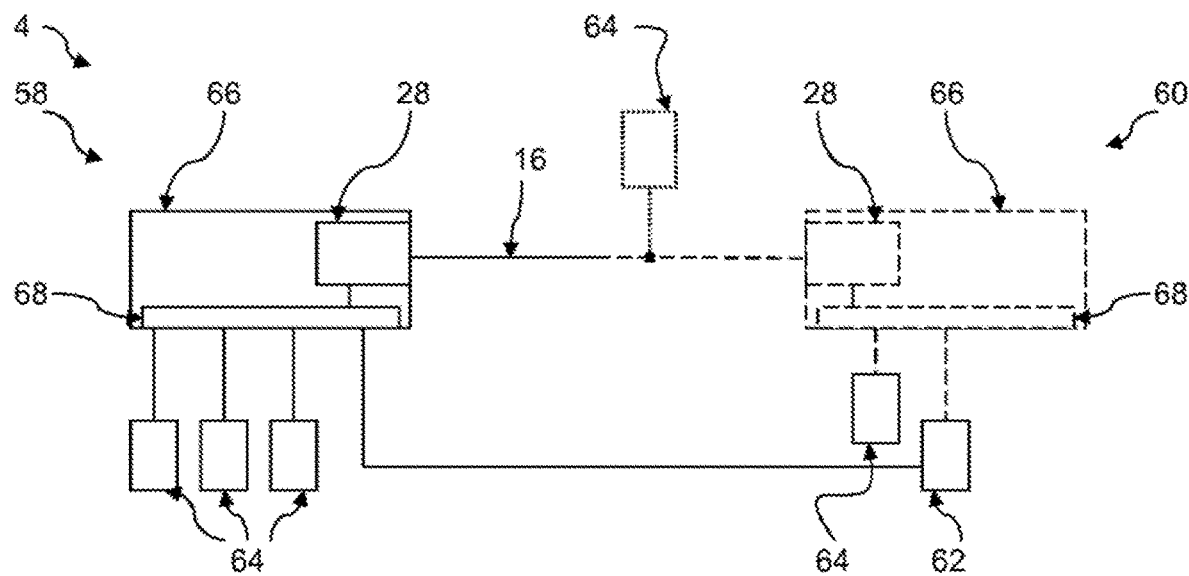
FIG. 7 shows a block diagram of a fifth embodiment of the on-board electrical system, having a power distributor.

Shown in FIG. 7 is a further variant of the on-board electrical system 4, which is similar in structure to the embodiment variant according to FIG. 6. Here, however, other electrical loads 64 are in each case integrated into both on-board electrical sub-systems 58, 60, and in addition another electrical load 64 is connected to the intermediate tap 16 for the purpose of supply.

Figure 8:
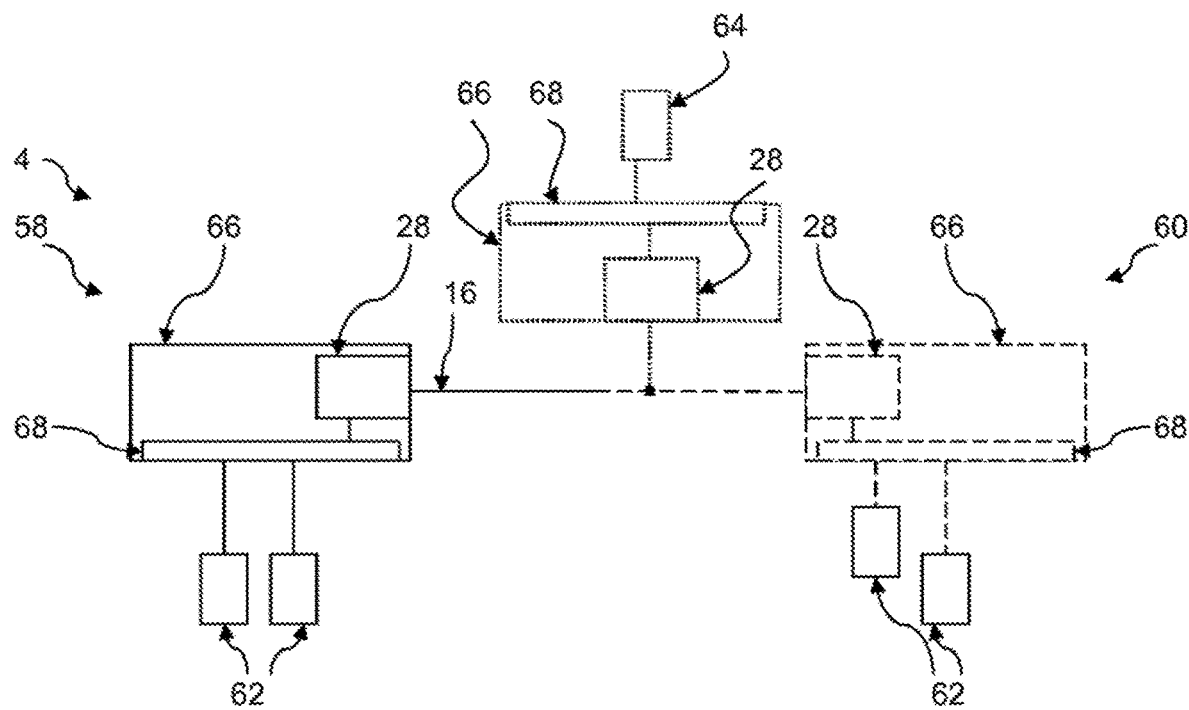
FIG. 8 shows a block diagram of a sixth embodiment of the on-board electrical system, having a power distributor.

As an alternative to the redundant supplying of the safety-relevant electrical loads 62, a redundancy can be achieved in that the safety-relevant electrical loads 62 are installed twice, specifically in such a manner that each safety-relevant electrical load 62 is present once in the first on-board electrical sub-system 58 and once in the second on-board electrical sub-system 60. Such an on-board electrical system embodiment is indicated in FIG. 8. In addition, in the case of this embodiment variant, all other electrical loads 64 are connected to the intermediate tap 16. This connection in this case is designed as an indirect connection, an additional fusebox 66, having an additional switching unit 28, being connected in series between the intermediate tap 16 and the other electrical loads 64. In this case, the power distributor 2 then has, as it were, three switching units 28.

Figure 9:
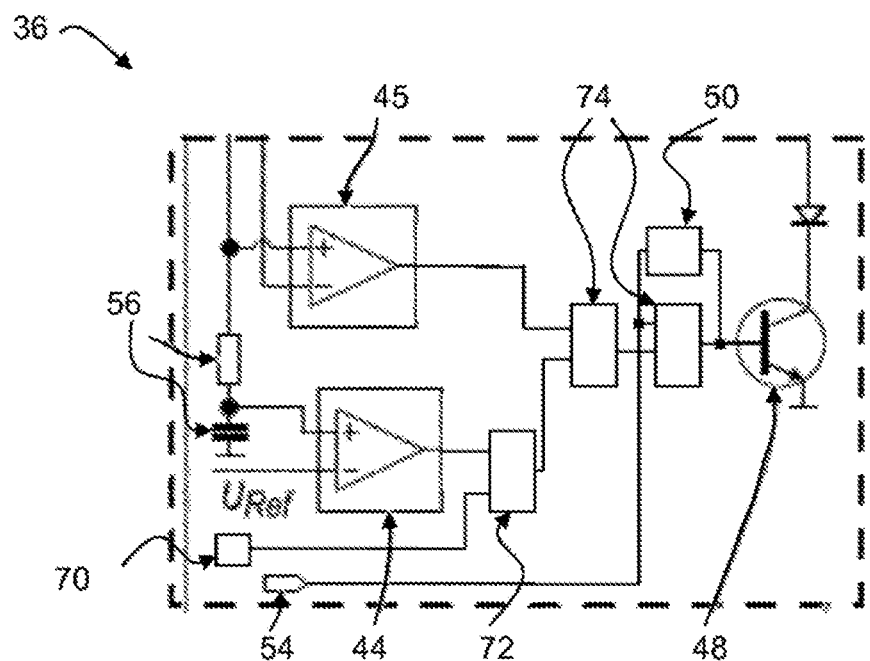
FIG. 9 shows a block diagram of a third embodiment of the control unit.
Figure 10:
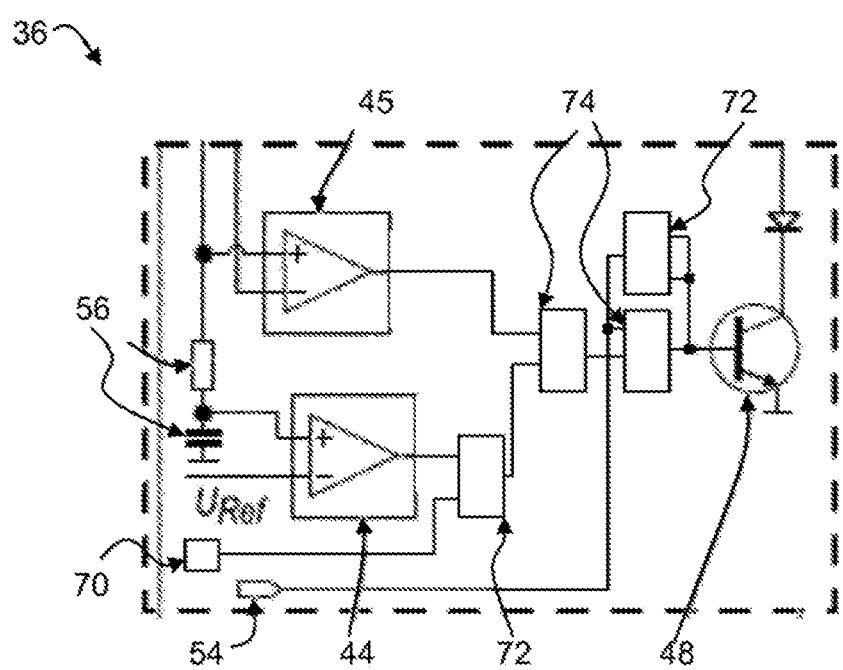
FIG. 10 shows a block diagram of a fourth embodiment of the control unit.

Finally, in the representations FIG. 9 and FIG. 10, two alternative embodiments of the control unit 36 are depicted. In the case of these embodiments, the logic circuit is constructed, not from AND gates 46 and OR gates 52, but by means of NAND gates 72 and NOR gates 74.

Furthermore, in the case of these embodiments of the control unit 36, a so-called "lock" function is realized, which makes it possible to block the reaction capability of a switching unit 28 having such a control unit 36, at least temporarily, thus for example for a period of approximately 100 to approximately 300 ρs. For this purpose, a switching signal or control signal is then supplied to the logic circuit of the control unit 36 of the switching unit 28, for example via a "lock" input 70, in such a manner that, at least temporarily, irrespective of the voltage monitored by means of the voltage monitoring unit 44, the semiconductor switch 48 can no longer be unblocked, and accordingly the associated switch 30 of the switching unit 28 cannot be blocked.

Figure 11:
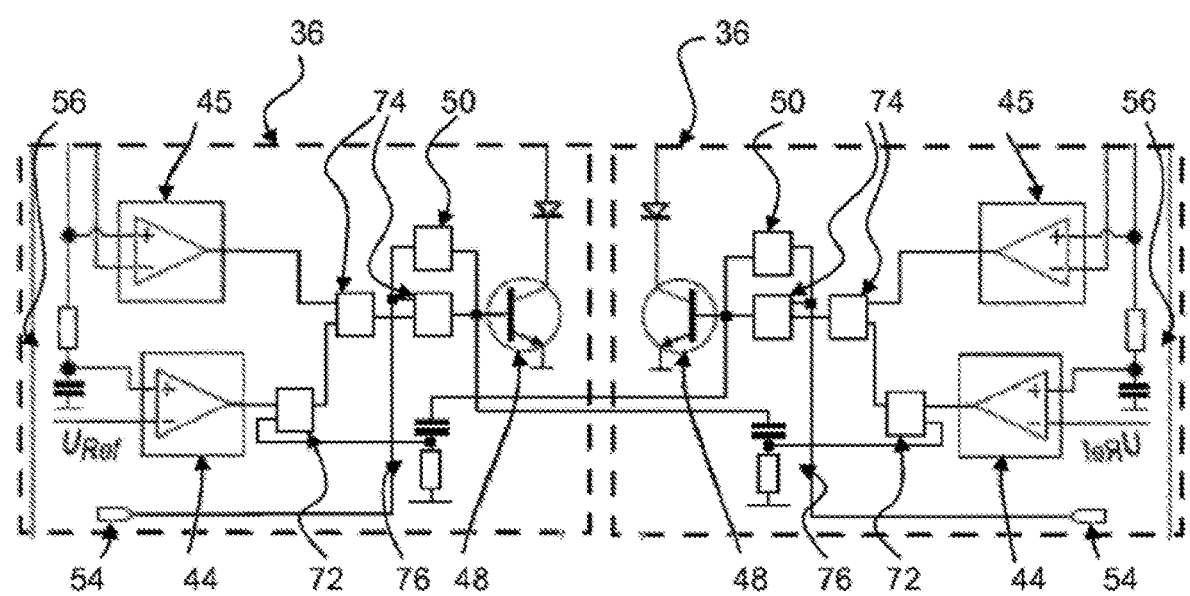
FIG. 11 shows a block diagram of a fifth embodiment of the control unit.

Typically in this case, the reaction capability of a switching unit 28 is to be blocked if, and only if, a further switching unit 28 of the same power distributor 2 has reacted or is just then reacting because of a fault situation. Therefore, in the exemplary embodiment according to FIG. 11, the logic circuits of two control units 36 of two switching units 28 of a power distributor 2 are linked to each other to realize such a "lock" function. In this case, the logic circuits of the two control units 36 are designed, apart from the link, such that they correspond to the logic circuit of the control unit 36 according to FIG. 9. To realize the link, in the case of both control units 36 the output of the NOR gate 74 that drives the associated semiconductor switch 48 of the respective control unit 36 is in each case connected, via an RC element 76, to an input of the NAND gate 72 of the respectively other control unit 36 that is connected in series after the associated voltage monitoring unit 44. As a consequence, a switching signal or control signal that, in one of the control units 36 of the power distributor 2, unblocks the associated semiconductor switch 48, then, as it were, simultaneously blocks an unblocking of the semiconductor switch 48 of the other control unit 36 of the power distributor 2.

The invention is not limited to the exemplary embodiment described above. Rather, other variants of the invention may also be derived by persons skilled in the art, without departure from the provisions of the invention. Moreover, in particular, all individual features described in connection with the exemplary embodiment can also be combined with each other in any manner, without departure from the provisions of the invention.

LIST OF REFERENCES 2 power distributor
4 on-board electrical system
6 motor vehicle
8 printed circuit board
10 power output
12 line segment
14 battery
16 intermediate tap/supply output
18 electrical load
20 distributor plate
22 connection arm
24 melting fuse
26 plug-in connector
28 switching unit
30 switch
32 semiconductor switch
34 blocking diode
36 control unit
38 internal voltage supply circuit
40 voltage pump
42 undervoltage protection
44 voltage monitoring unit
45 current-direction monitoring unit
46 AND gate
48 semiconductor switch
50 set memory
52 OR gate
54 reset contact
56 RC element
58 first on-board electrical sub-system
60 second on-board electrical sub-system
62 safety-relevant electrical load
64 other electrical load
66 fusebox
68 distributor busbar
70 "lock" input
72 NAND gate
74 NOR gate
76 RC element

The invention claimed is:

1. A power distributor, comprising:
two power outputs and an intermediate tap;
two switching units being a respective switching unit for each of said power outputs, said switching unit having a switch for blocking an associated power output if required;
each of said switching units being configured such that a blocking of the associated said power output is effected if, in the event of a voltage drop at the associated said power output and/or at said intermediate tap to below a first setpoint value, a fault situation is ascertained, and wherein, the greater the voltage drop, the more rapidly the blocking of the associated said power output is effected.

2. The power distributor according to claim 1, wherein, in the event of a fault situation, the power output respectively connected most directly to the power source is blocked, or only the power output respectively connected most directly to the power source is blocked.

3. The power distributor according to claim 1, wherein said intermediate tap is a distributor node or a supply output for supplying a plurality of electrical loads.

4. The power distributor according to claim 1, wherein each of said switching units has a current-direction monitoring unit.

5. The power distributor according to claim 4, wherein each of said switching units has a current-direction monitoring unit with a comparator circuit, and said comparator circuit is configured, for the purpose of determining the current direction, to compare the voltages before and after the associated switch, or before and after an auxiliary resistor at the corresponding said power output, with each other.

6. The power distributor according to claim 1, wherein each of said switching units is linked to a voltage monitoring unit for monitoring the voltages at said power outputs and/or the voltage at said intermediate tap, or each of said switching units has a voltage monitoring unit for monitoring the voltage at the associated said power output and/or at said intermediate tap is monitored.

7. The power distributor according to claim 6, wherein each voltage monitoring unit has a comparator circuit for comparing the voltage at the associated said power output and/or at said intermediate tap with a reference voltage, the reference voltage corresponding to the first setpoint value.

8. The power distributor according to claim 6, further comprising a delay element connected in series before each said voltage monitoring unit, such that a voltage drop at the associated said power output and/or at said intermediate tap causes a voltage drop having an altered time characteristic at the respective said voltage monitoring unit.

9. The power distributor according to claim 1, wherein each of said switching units has a current-direction monitoring unit, having a comparator circuit with an output linked to an output of a voltage monitoring unit having a comparator circuit for a joint evaluation of the associated output signals.

10. The power distributor according to claim 9, wherein said outputs of said two comparator circuits of each switching unit are linked to each other via a logic gate.

11. The power distributor according to claim 10, wherein said outputs of said two comparator circuits of each switching unit are linked to each other via an AND gate and an OR gate connected in series after said AND gate.

12. The power distributor according to claim 11, wherein each of said switching units has a set memory configured to permanently maintain an initiated blocking.

13. The power distributor according to claim 12, wherein said set memory is connected to an output of said OR gate and additionally to an input of said OR gate.

14. The power distributor according to claim 1, wherein a "lock" function is realized, by means of which a reaction capability of another switching unit or of all other switching units is blocked temporarily, as soon as a switching unit has reacted because of a fault situation.

15. The power distributor according to claim 1, wherein each of said switching units is configured to effect the blocking of the associated said power output without communication with other switching units.

16. The power distributor according to claim 1, wherein said two switching units are spatially separate from each other and said intermediate tap is a conductor connection, which connects said two switching units to each other in an electrically conducting manner.

17. The power distributor according to claim 16, wherein at least one of said two switching units is arranged in a fusebox, together with a distributor busbar and/or a number of melting fuses and/or a number of electronic fuses.

18. An on-board electrical system for a motor vehicle, comprising at least one power distributor according to claim 1.

19. The on-board electrical system according to claim 18, comprising a plurality of power distributors each according to claim 1 and wherein a number of electrical loads are connected to each power distributor via the intermediate tap thereof, wherein said power distributors are interconnected via their power outputs and intermediate connecting conductors, and wherein two electrical energy sources are connected at two power outputs or at two intermediate taps, or at one power output and at one intermediate tap of two power distributors, for the purpose of redundant supply of electric power to the electrical loads, such that, in the event of a short circuit along one of the connecting conductors, the latter is electrically isolated by the connected power distributors.

20. The on-board electrical system according to claim 19, wherein said power distributors are connected in a distributor chain, respectively connected at the ends of which, via a supply output or a power output, is one of the electrical energy sources.

21. The on-board electrical system according to claim 19, wherein said power distributors are connected in a power ring, wherein an electrical energy source is in each case connected to two power distributors via a supply output or a power output.

22. The on-board electrical system according to claim 18, comprising a number of safety-relevant electrical loads, which are used to realize a safety-relevant function, and a number of other electrical loads, as well as a first on-board electrical sub-system and a second on-board electrical sub-system, wherein the first and the second on-board electrical sub-system are connected to each other via the power distributor, wherein, for the purpose of redundant supply, the safety-relevant electrical loads are each integrated into both on-board electrical sub-systems, and wherein, for the purpose of single supply, the other electrical loads are each integrated into one of the two on-board electrical sub-systems.

23. The on-board electrical system according to claim 22, wherein all other electrical loads are integrated into the first on-board electrical sub-system.

24. The on-board electrical system according to claim 18, comprising: a number of safety-relevant electrical loads, which are used to realize a safety-relevant function, and a number of other electrical loads, as well as a first on-board electrical sub-system and a second on-board electrical sub-system, wherein the first and the second on-board electrical sub-system are connected to each other via the power distributor, wherein, for the purpose of redundant supply, the safety-relevant electrical loads are each integrated into both on-board electrical sub-systems, and wherein, for the purpose of single supply, the other electrical loads are connected to the intermediate tap.

25. The on-board electrical system according to claim 24, wherein the other electrical loads are connected to the intermediate tap via an additional switching unit or via an additional power distributor according to claim 1.

* * * * *